United States Patent
Chitaka et al.

(10) Patent No.: US 8,981,240 B2
(45) Date of Patent: Mar. 17, 2015

(54) ELECTRONIC CIRCUIT BOARD CASE

(71) Applicant: DENSO Corporation, Kariya-city, Aichi-pref. (JP)

(72) Inventors: Hiroki Chitaka, Kariya (JP); Mitsuteru Suzaki, Chiryu (JP)

(73) Assignee: Denso Corporation, Kariya (JP)

( * ) Notice: Subject to any disclaimer, the term of this patent is extended or adjusted under 35 U.S.C. 154(b) by 46 days.

(21) Appl. No.: 13/742,447

(22) Filed: Jan. 16, 2013

(65) Prior Publication Data

US 2013/0213708 A1   Aug. 22, 2013

(30) Foreign Application Priority Data

Feb. 22, 2012   (JP) .................... 2012-36618

(51) Int. Cl.
*H01R 13/502* (2006.01)
*H05K 5/00* (2006.01)
*H01R 13/46* (2006.01)
*H05K 7/18* (2006.01)
*H05K 5/02* (2006.01)

(52) U.S. Cl.
CPC .................. *H05K 5/0239* (2013.01)
USPC ............. 174/559; 174/50; 174/520; 174/560; 174/563; 361/752; 361/796

(58) Field of Classification Search
USPC ............ 174/50, 520, 559, 560, 563; 361/752, 361/796
See application file for complete search history.

(56) References Cited

U.S. PATENT DOCUMENTS

| 6,492,590 | B1* | 12/2002 | Cheng ............................. 174/50 |
| 6,816,381 | B2* | 11/2004 | Takeuchi ....................... 361/752 |
| 2002/0112870 | A1* | 8/2002 | Kobayashi et al. ............. 174/50 |
| 2007/0109730 | A1* | 5/2007 | Shigyo et al. ................. 361/600 |
| 2009/0068862 | A1* | 3/2009 | Honda ............................. 439/78 |
| 2009/0129035 | A1* | 5/2009 | Kojima ........................... 361/752 |
| 2011/0090625 | A1 | 4/2011 | Oota |
| 2012/0069532 | A1* | 3/2012 | Azumi et al. .................. 361/752 |

FOREIGN PATENT DOCUMENTS

| JP | 06-002755 U | 1/1994 |
| JP | 10-135649 A | 5/1998 |
| JP | 2000-031660 A | 1/2000 |
| JP | 2011-103445 A | 5/2011 |
| JP | 2012-228903 A | 11/2012 |

OTHER PUBLICATIONS

Notification of Reason for Refusal issued Dec. 9, 2014, in corresponding JP Application No. 2012-036618 (with English translation).

\* cited by examiner

*Primary Examiner* — Timothy Thompson
*Assistant Examiner* — Sherman Ng

(57) ABSTRACT

A case body portion accommodates an electronic circuit board. The case body portion has a rib projected from at least a part of a periphery of the opening. A lid has a flange, which is in contact with an outer periphery of the rib, when the lid is mounted on the case body portion to cover the opening. The rib has a raised portion raised outward from a part of an outer periphery of the rib.

7 Claims, 4 Drawing Sheets

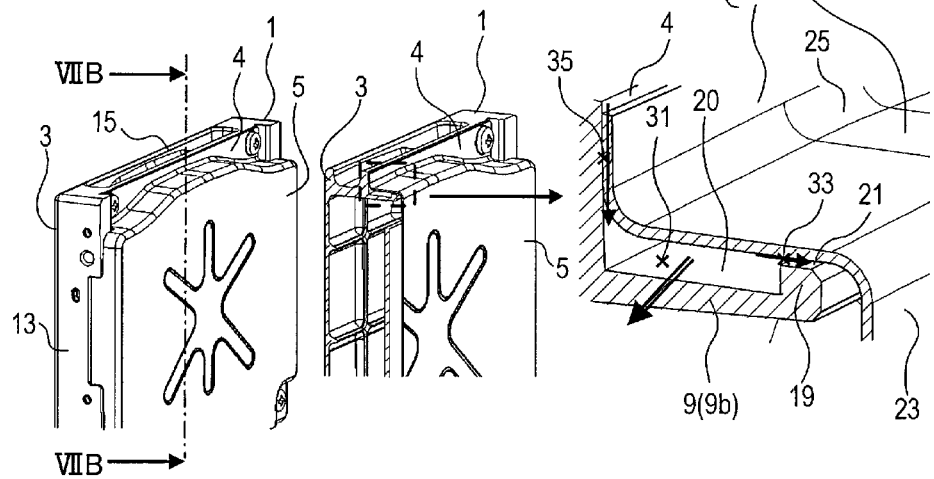
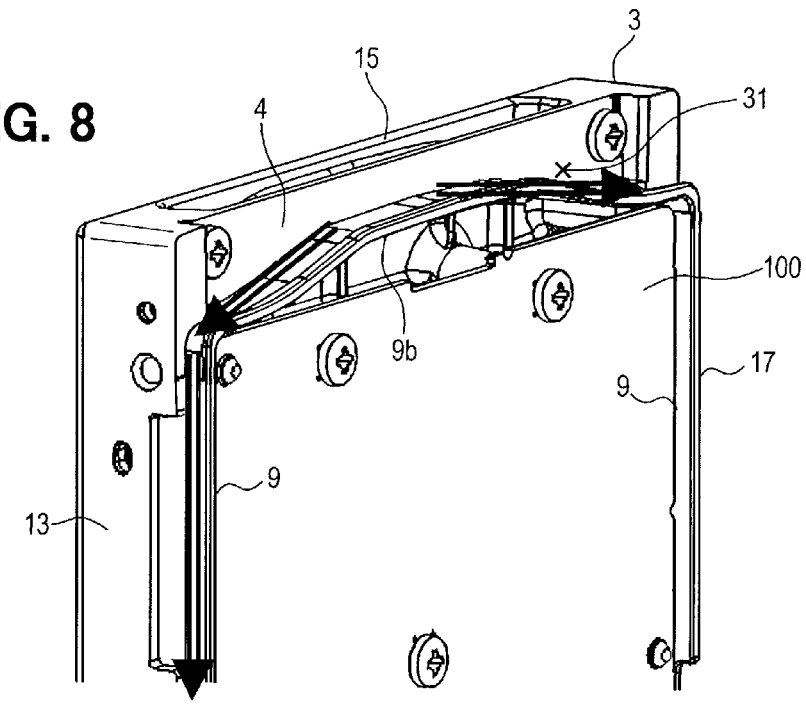

ELECTRONIC CIRCUIT BOARD CASE

CROSS REFERENCE TO RELATED APPLICATION

This application is based on reference Japanese Patent Application No. 2012-36618 filed on Feb. 22, 2012, the disclosure of which is incorporated herein by reference.

TECHNICAL FIELD

The present disclosure relates to an electronic circuit board case.

BACKGROUND

In general, an electronic circuit board case configured to accommodate an electronic circuit board is required to have a waterproof property to restrict permeation of water, in consideration of exposure to dew condensation and spray of water. It is conceivable to provide a sealing member in a joined portion of an electronic circuit board case to enhance waterproof property. However, provision of a sealing member requires additional sealing member and additional manufacturing process for equipping the sealing member to the electronic circuit board case. In consideration of this, for example, JP-A-H10-135649 discloses an electronic circuit board case having waterproof property without using a sealing member. However, the configuration of JP-A-H10-135649 may not have a sufficient waterproof property.

SUMMARY

It is an object of the present disclosure to produce an electronic circuit board case having a high waterproof property.

According to an aspect of the present disclosure, an electronic circuit board case is configured to accommodate an electronic circuit board. The electronic circuit board case comprises a case body portion having an opening. The electronic circuit board case further comprises a lid for covering the opening. The case body portion has a rib projected from at least a part of a periphery of the opening. The lid has a flange configured to be in contact with an outer periphery of the rib when the lid is mounted on the case body portion. The rib has a raised portion raised outward from a part of an outer periphery of the rib.

BRIEF DESCRIPTION OF THE DRAWINGS

The above and other objects, features and advantages of the present invention will become more apparent from the following detailed description made with reference to the accompanying drawings. In the drawings:

FIG. 7A is a perspective view showing the electronic circuit board case, FIG. 7B is a sectional view taken along the line VIIB-VIIB in FIG. 7A, and FIG. 7C is an enlarged view showing a portion of the electronic circuit board case indicated by the dotted frame in FIG. 7B; and FIG. 8 is a view showing flow of water along a passage in the electronic circuit board case.

DETAILED DESCRIPTION

As follows, an embodiment of the present disclosure will be described with reference to drawings.

1. Configuration of Electronic Circuit Board Case

Figure 1:
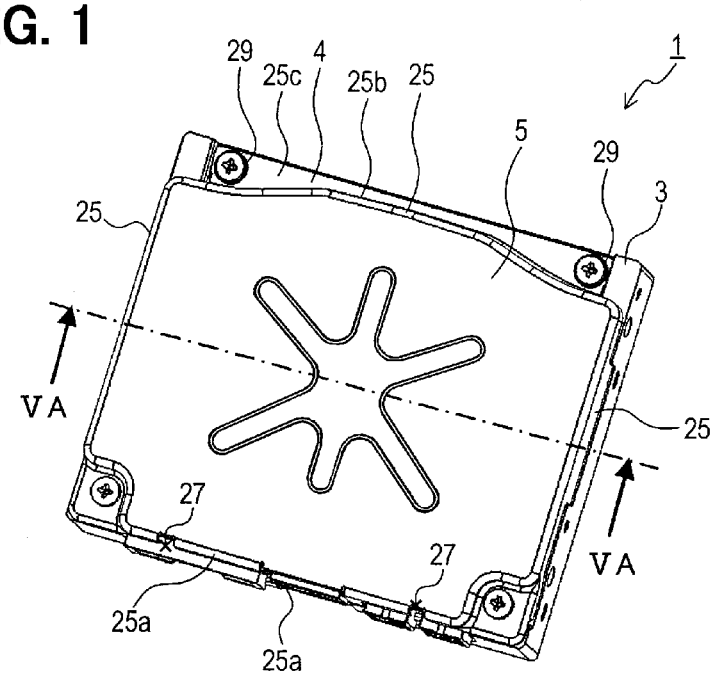
FIG. 1 is a perspective view showing an electronic circuit board case.
Figure 2:
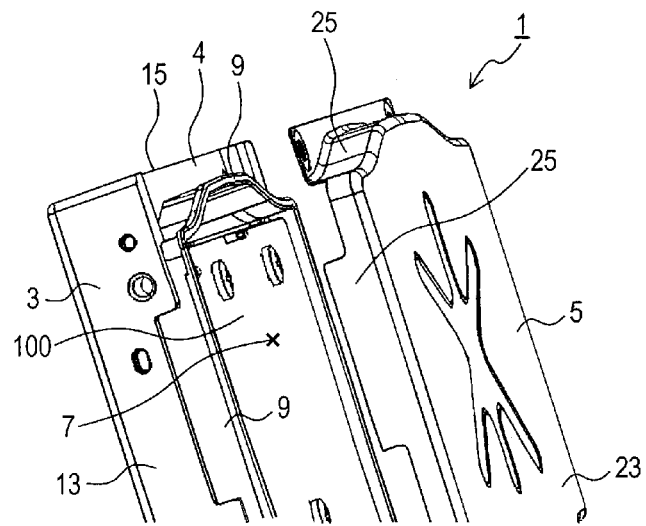
FIG. 2 is a perspective view showing a case body portion and a lid of the electronic circuit board case.
Figure 3:
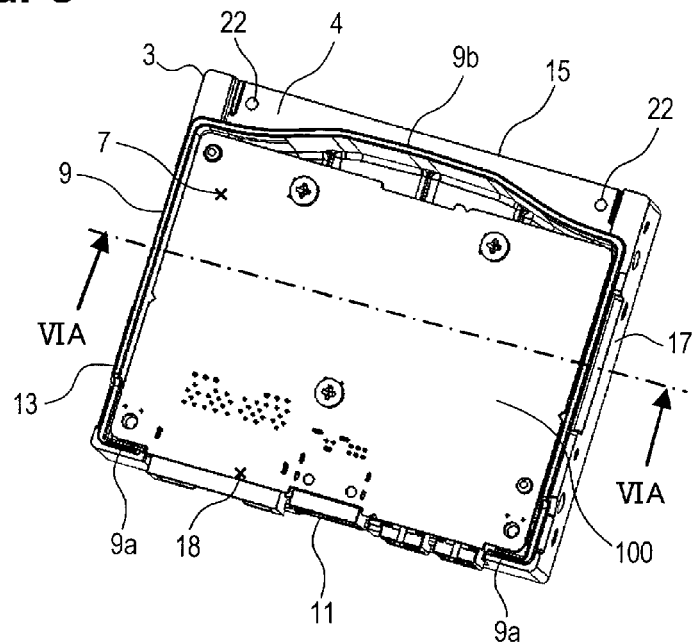
FIG. 3 is a perspective view showing the case body portion.

As follows, the configuration of an electronic circuit board case 1 will be described with reference to FIGS. 1 to 7C. As shown in FIG. 1, the electronic circuit board case 1 is a container, which is substantially in a rectangular parallelepiped shape. The electronic circuit board case 1 includes a case body portion 3 and a lid 5. As shown in FIGS. 2 and 3, the electronic circuit board case 1 is configured to accommodate an electronic circuit board 100 therein.

Referring to FIGS. 2 and 3, the case body portion 3 is a hollow box-like member having an upper surface 4 defining an opening 7, which is substantially in a rectangle shape. The case body portion 3 is equipped with a plate-shaped rib 9, which is raised around the opening 7. Referring to FIG. 3, the case body portion 3 has four lateral sides 11, 13, 15, and 17. The rib 9 has a portion, which is substantially seamless around the three lateral sides 13, 15, and 17. The rib 9 has portions 9a, which are formed around both ends of the lateral side 11, respectively, and has a center defining a notch 18 therebetween. The notch 18 functions as an opening from which a connector (not shown) connected with the electronic circuit board 100 is drown. The case body portion 3 is formed by die-casting a material in a casting die.

Figure 5A:
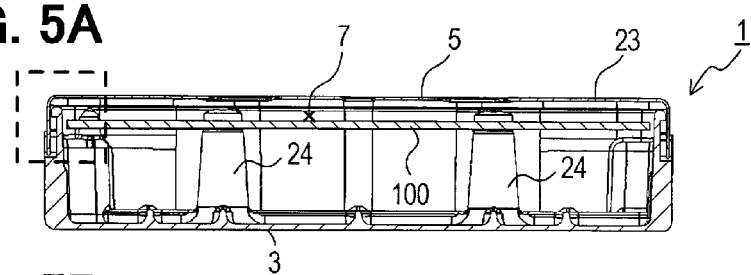
FIG. 5A is a sectional view taken along the line VA-VA in FIG. 1.
Figure 5B:
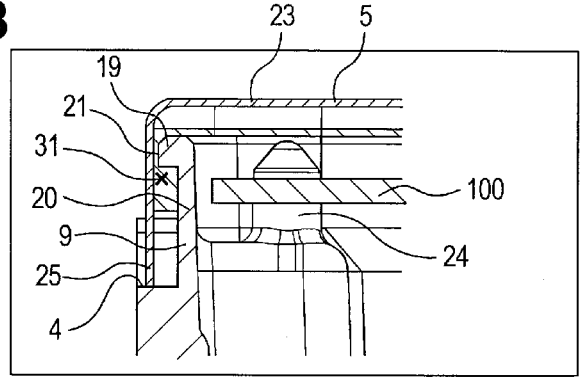
FIG. 5B is an enlarged view showing a portion of the electronic circuit board case indicated by the dotted frame in FIG. 5A.
Figure 6A:
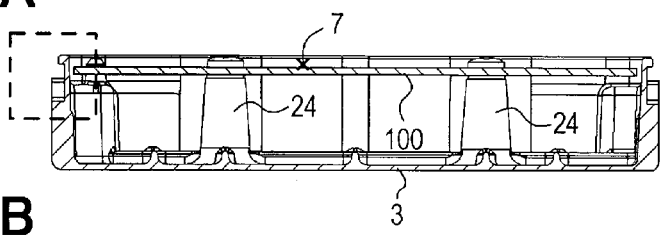
FIG. 6A is a sectional view taken along the line VIA-VIA in FIG. 3.
Figure 6B:
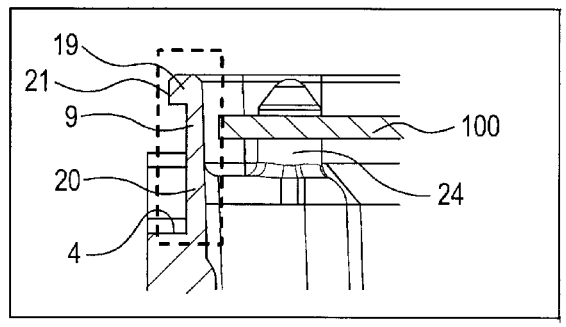
FIG. 6B is an enlarged view showing a portion of the case body portion indicated by the dotted frame in FIG. 6A.

Referring to FIGS. 5B, 6B, and 7C, the rib 9 has an outer periphery partially equipped with a raised portion 19 raised outward. The raised portion 19 is located on the opposite side from the opening 7. The raised portion 19 is located at the tip end of the rib 9. The raised portion 19 has an outer periphery 21 defined with a flat surface. The rib 9 has a non-raised portion 20, which is other than the raised portion 19 and is thinner than the raised portion 19. The rib 9 has an inner periphery on the side of the opening 7. The inner periphery of the rib 9 is substantially even from its tip end to its root. The shape of the rib 9 is substantially the same entirely in the rib 9. As shown in FIG. 3, the rib 9 has a portion 9b at the center. The portion 9b of the rib 9 is adjacent to a lateral side 15 and opposed to the portion 9a. The portion 9b is projected outward beyond both ends of the rib 9. The portion 9b projected outward functions as a hook when the electronic circuit board 100 is mounted on the case body portion 3. In addition, the shape of the portion 9b projected outward functions to guide water, which drips from the upper surface of the lid 5, to flow to the outside.

In FIG. 3, the upper surface 4 of the case body portion 3 has screw holes 22 located outside the rib 9. The screw holes 22 are used for mounting the lid 5. Referring to FIGS. 5A, 5B, 6A, and 6B, the case body portion 3 has support portions 24 therein. The support portions 24 are mounted with the electronic circuit board 100. The electronic circuit board 100 is affixed to the support portions 24 with a faster such as a screw. Referring to FIGS. 5B and 6B, the electronic circuit board 100 and an electronic device (not shown) mounted on the electronic circuit board 100 are located on the lower side relative to the tip end of the rib 9 in the vertical direction of FIGS. 5B and 6B.

Figure 4:
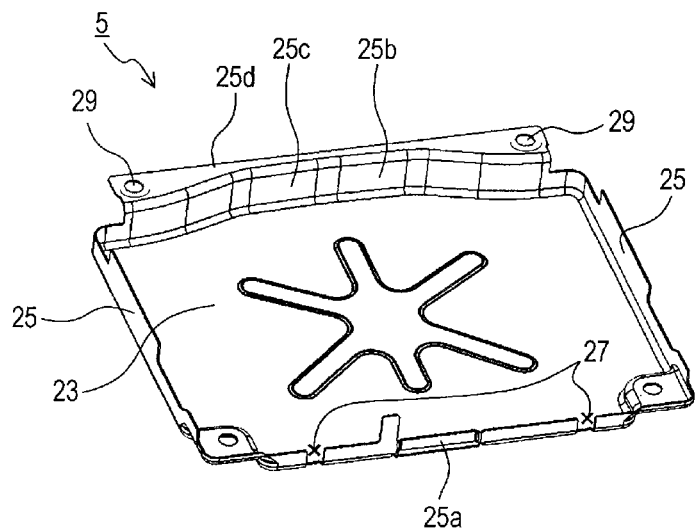
FIG. 4 is a perspective view showing the lid.

Referring to FIG. 4, the lid 5 has a top plate portion 23 and a flange 25. The top plate portion 23 is a flat member substantially in a rectangle shape. The flange 25 is raised along the outer periphery of the top plate portion 23. The lid 5 is a press-formed component manufactured by implementing a drawing process on, for example, a sheet material. The flange 25 can be easily formed into a seamless member by implementing the drawing process. The lid 5 may be formed into a component shown in FIG. 4 by implementing another manufacturing process than the drawing process. Referring to FIGS. 2, 5A, and 5B, the lid 5 is mounted onto the case body portion 3, such that the top plate portion 23 covers the opening 7 of the case body portion 3, and the flange 25 is in contact with the rib 9 at the outer periphery.

In FIG. 4, the flange 25 of the lid 5 is substantially seamless in the three sides of the lid 5 among the four sides of the lid 5. The flange 25 has notches 27 in the one remaining side of the lid 5 among the four sides. Referring to FIG. 1, when the lid 5 is mounted on the case body portion 3, the seamless three sides of the flange 25 are in contact with the outer periphery of the rib 9, which is adjacent to the lateral sides 13, 15, and 17 of the case body portion 3. In addition, the other one side (portion 25a) of the flange 25 having the notches 27 is adjacent to of the lateral side 11 of the case body portion 3. In the present state, the notches 27 of the flange 25 overlap with the notch 18 of the rib 9. It is noted that, the flange 25 and the rib 9 may have a minute space therebetween, in consideration of assembly.

Referring to FIGS. 4 and 7C, the flange 25 has a portion 25b opposed to the portion 25a of the flange 25. The portion 25b of the flange 25 is substantially in an L-shape in cross section and has an orthogonal portion 25c and a parallel portion 25d. The orthogonal portion 25c is substantially perpendicular to the top plate portion 23. The parallel portion 25d is substantially in parallel with the top plate portion 23. Strictly, the parallel portion 25d is at an angle of, for example, 1 degree relative to the top plate portion 23. Referring to FIG. 7C, when the lid 5 is mounted on the case body portion 3, the orthogonal portion 25c is in contact with the outer periphery of the portion 9b of the rib 9. In addition, the parallel portion 25d is in contact of a portion of the upper surface 4 outside the rib 9. It is noted that, the orthogonal portion 25c of the flange 25 and the portion 9b of the rib 9 may have a minute space therebetween, in consideration of assembly. Referring to FIGS. 1 and 4, the parallel portion 25d has screw holes 29, which overlap with the screw holes 22 of the case body portion 3, respectively, when the lid 5 is mounted on the case body portion 3. The lid 5 can be affixed to the case body portion 3 by screwing screw components through the screw holes 22 and the screw holes 29, respectively. The center of the portion 25b of the flange 25 projects beyond both the ends of the flange 25, such that the center of the portion 25b coincides with the portion 9b of the rib 9 in shape.

Referring to FIGS. 5B and 7C, the flange 25 is in contact with the outer periphery of the rib 9 when the lid 5 is mounted on the case body portion 3. In the present state, the inner surface of the flange 25 is in contact with the raised portion 19 of the rib 9 or opposed to the raised portion 19 of the rib 9 via a minute space therebetween. In addition, the inner surface of the flange 25 and the non-raised portion 20 of the rib 9 define a passage 31 therebetween. The passage 31 communicates at all regions in which the flange 25 is in contact with the outer periphery of the rib 9. That is, the passage 31 exists continuously around the three lateral sides 13, 15, and 17 of the case body portion 3. In addition, the passage 31 communicates with the outside at the notch 27 of the flange 25.

Referring to FIGS. 5B and 7C, the tip end of the flange 25 is in contact with the upper surface 4 of the case body portion 3 when the lid 5 is mounted on the case body portion 3.

2. Application of Electronic Circuit Board Case

The electronic circuit board case 1 accommodating the electronic circuit board 100 therein may be built in an instrument panel of a vehicle. The electronic circuit board case 1 is equipped to a device such as an instrument panel of a vehicle, such that the position of the lateral side 11 of the case body portion 3 is lower than the position of the lateral side 15 of the case body portion 3 in the vertical direction. The electronic circuit board case 1 may be arbitrarily located at various angles in various directions, as long as the lateral side 11 of the case body portion 3 is lower than the position of the lateral side 15 of the case body portion 3 in the vertical direction. For example, the electronic circuit board case 1 may be located at an angle, such that the lid 5 is located on the lower side, and the case body portion 3 is located on the upper side, and vice versa.

3. Operation Effect of Electronic Circuit Board Case (1) The electronic circuit board case 1 has a high waterproof property to restrict intrusion of water into the electronic circuit board case 1. The reason will be described below. Referring to FIG. 7C, it is conceivable that water may permeate from the outside of the case body portion 3 into the case body portion 3 through a minute gap 35 between the upper surface 4 of the case body portion 3 and the flange 25. In this case, the water reaches the passage 31 formed between the flange 25 and the rib 9.

As described above, the passage 31 continuously extends around the three lateral sides 13, 15, and 17 of the case body portion 3. In addition, the electronic circuit board case 1 is inclined downward to the lateral side 11 of the case body portion 3. Therefore, as shown in FIG. 8, the water intruding into the passage 31 flows through the passage 31 along the rib 9 toward the lateral side 11. In FIG. 8, the arrow represents flow of the water. In this case, water is applied with force caused by gravity and capillarity action to flow in the direction shown by the arrow in FIG. 8. The passage 31 is larger than a small clearance 33, which is formed between the raised portion 19 of the rib 9 and the flange 25. Therefore, force applied to water to flow along the passage 31 is greater than force (water pressure) applied to water to pass through the small clearance 33.

The space in the case body portion 3 is much greater than the space in the small clearance 33 via the boundary therebetween. Therefore, even though capillary action causes water pressure in the small clearance 33, surface tension also works on water to stay on the boundary. Thus, the surface tension negates the water pressure caused by the capillary action in the small clearance 33. Consequently, it is possible to restrict infiltration of water from the small clearance 33 into the case body portion 3. The water flowing through the passage 31 is drained to the outside of the lid 5 through the notch 27. (2) The case body portion 3 has the screw holes 22 outside the rib 9. The present configuration restricts infiltration of water into the case body portion 3 through the screw holes 22. (3) The electronic circuit board 100 and the electronic device mounted on the electronic circuit board 100 are located at the position lower than the tip end of the rib 9 and are distant from the lid 5. It is conceivable to mount the electronic circuit board case 1 to locate the lid 5 on the lower side. In such a state, water may intrude into the case body portion 3 through the small clearance 33 and may flow along the lid 5. Even in such a case, the electronic circuit board 100 and the electronic device mounted on the electronic circuit board 100 can be protected from contact with the water, in the above-described configuration. (4) The electronic circuit board case 1 has the notch (non-flange portion) 27 where the flange 25 is not formed around the opening 7. The present configuration enables to drain water from the passage 31 through the notch 27 to the outside of the electronic circuit board case 1. (5) The raised portion 19 is located at the tip end of the rib 9. The present configuration enlarges the passage 31 compared with a configuration where the passage 31 is formed with the rib 9, which is located on the side of the root of the raised portion 19, thereby to enhance its waterproof property.

The present disclosure is not limited to the above embodiment and may be practiced in various modes within a scope of the present disclosure.

For example, the rib 9 may be equipped to one side of the case body portion 3, two sides of the case body portion 3, or all the four sides of the case body portion 3.

The flange 25 may entirely have the section in an L-shape same as the sectional shape of the portion 25*b*.

The support portions 24 may be equipped to the lid 5. The electronic circuit board 100 may be affixed to the lid 5, instead of being affixed to the case body portion 3.

The portion 25*b* of the flange 25 may be in a flat shape. Each of the three sides of the flange 25 may be in a shape and may have the center portion projecting outward beyond both the ends, similarly to the portion 25*b*.

The rib 9 may be equipped to the lid 5, and the flange 25 may be equipped to the case body portion 3.

Summarizing the above disclosure, the above-described electronic circuit board case may include the case body portion, which has the opening, and the lid, which covers the opening, and may accommodate the electronic circuit board therein. In the electronic circuit board case of the present disclosure, the case body portion may be equipped with a rib raised from at least a part of the periphery of the opening. In this case, the lid may be equipped with the flange, which is in contact with the outer periphery of the rib, when the lid is mounted on the case body portion. In this case, the rib may be equipped with the raised portion raised outward from a part of the outer periphery of the rib.

With the present configuration, waterproof property of the electronic circuit board case can be enhanced. It is noted that, the electronic circuit board case of the present disclosure has a high waterproof property even in a case where being mounted in various angles.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An electronic circuit board case configured to accommodate an electronic circuit board, the electronic circuit board case comprising:
   a case body portion having an upper surface defining an opening; and
   a lid for covering the opening, wherein
   the case body portion has a rib projected from at least a part of a periphery of the opening,
   the lid has a flange configured to be at least substantially in contact with an outer periphery of the rib and the upper surface of the case when the lid is mounted on the case body portion,
   the rib has a raised portion raised outward from a part of an outer periphery of the rib and a non-raised portion which is thinner than the raised portion, and
   an inner surface of the flange, the raised and the non-raised portions of the rib, and the upper surface of the case define a passage therewithin.

2. The electronic circuit board case according to claim 1, wherein
   the lid has a non-flange portion around the opening, and
   the non-flange portion is not equipped with the flange.

3. The electronic circuit board case according to claim 1, wherein the raised portion is located at a tip end of the rib.

4. The electronic circuit board case according to claim 1, wherein the case body portion has a screw hole, which is located outside the rib for mounting the lid.

5. The electronic circuit board case according to claim 1, wherein the passage exists continuously around the case.

6. The electronic circuit board case according to claim 5, wherein the passage communicates with an outside at a notch of the flange.

7. The electronic circuit board case according to claim 1, wherein the rib extends from the upper surface to a tip end, the raised portion extends radially outward from the tip end on the opposite side from the opening.

* * * * *